(12) United States Patent
Fei et al.

(10) Patent No.: US 12,132,149 B2
(45) Date of Patent: Oct. 29, 2024

(54) MICRO LIGHT-EMITTING DEVICE AND DISPLAY APPARATUS THEREOF

(71) Applicant: PlayNitride Display Co., Ltd., MiaoLi County (TW)

(72) Inventors: Yuan-Ting Fei, MiaoLi County (TW); Kuang-Yuan Hsu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 472 days.

(21) Appl. No.: 17/529,237

(22) Filed: Nov. 17, 2021

(65) Prior Publication Data

US 2022/0376138 A1    Nov. 24, 2022

(30) Foreign Application Priority Data

May 24, 2021  (TW) ................................ 110118601

(51) Int. Cl.
*H01L 33/38* (2010.01)
*H01L 27/15* (2006.01)
(Continued)

(52) U.S. Cl.
CPC .......... *H01L 33/382* (2013.01); *H01L 27/156* (2013.01); *H01L 33/12* (2013.01); *H01L 33/22* (2013.01); *H01L 33/62* (2013.01)

(58) Field of Classification Search
CPC . H01L 33/382; H01L 27/156; H01L 25/0753; H01L 33/62; H01L 33/12; H01L 33/22; H01L 33/20; H01L 33/58; H01L 33/44; H01L 33/40; H01L 21/3065; H01L 33/007; H01L 33/32; H01L 33/0075; H01L 33/0062; H01L 21/302; H01L 33/005; H01L 33/0093; H01L 2933/0083; H01L 2933/0091; H01L 2933/0058; H01L 2224/14; H01L 2224/16225; G02B 1/11

(Continued)

(56) References Cited

U.S. PATENT DOCUMENTS

2004/0016936 A1* 1/2004 Tanaka ................... H01L 33/20
257/E33.068
2006/0202219 A1* 9/2006 Ohashi ................... H01L 24/32
257/E33.068

(Continued)

FOREIGN PATENT DOCUMENTS

CN    103117347    5/2013
CN    103545212    1/2014

(Continued)

OTHER PUBLICATIONS

"Office Action of China Counterpart Application", issued on Dec. 1, 2022, p. 1-p. 8.

Primary Examiner — Mouloucoulaye Inoussa
(74) Attorney, Agent, or Firm — JCIPRNET

(57) ABSTRACT

A micro light-emitting device includes an epitaxial structure. The epitaxial structure has a bottom surface and includes a plurality of grooves, and the grooves are located on the bottom surface. Each of the grooves includes a plurality of sub-grooves, and the sub-grooves define an inner wall of each of the grooves. A ratio of a size of each of the grooves to a size of each of the sub-grooves is greater than 1 and less than or equal to 4000.

8 Claims, 15 Drawing Sheets

(51) Int. Cl.
*H01L 33/12* (2010.01)
*H01L 33/22* (2010.01)
*H01L 33/62* (2010.01)

(58) Field of Classification Search
USPC .... 257/98, 33.072, 99, 627, 33.062, 29.004, 257/94; 438/29, 479, 22
See application file for complete search history.

(56) References Cited

U.S. PATENT DOCUMENTS

| | | | | |
|---|---|---|---|---|
| 2007/0262330 | A1* | 11/2007 | Lee | H01L 33/22 |
| | | | | 257/79 |
| 2008/0277686 | A1* | 11/2008 | Tsai | H01L 21/0237 |
| | | | | 257/E33.006 |
| 2009/0078954 | A1* | 3/2009 | Shim | H01L 33/22 |
| | | | | 257/98 |
| 2010/0224894 | A1* | 9/2010 | Kim | H01L 33/007 |
| | | | | 257/E33.074 |
| 2011/0042711 | A1* | 2/2011 | Choi | H01L 33/32 |
| | | | | 257/E33.023 |
| 2012/0009768 | A1* | 1/2012 | Tadatomo | C30B 29/403 |
| | | | | 438/479 |
| 2012/0043568 | A1* | 2/2012 | Yan | H01L 33/44 |
| | | | | 257/98 |
| 2012/0214267 | A1 | 8/2012 | Wang et al. | |
| 2013/0119424 | A1* | 5/2013 | Kang | H01L 33/50 |
| | | | | 257/98 |
| 2013/0126924 | A1* | 5/2013 | Chen | H01L 33/22 |
| | | | | 257/E33.072 |
| 2013/0126925 | A1* | 5/2013 | Shibata | H01L 33/0093 |
| | | | | 257/98 |
| 2013/0214245 | A1* | 8/2013 | Chang | H01L 33/06 |
| | | | | 257/13 |
| 2014/0034981 | A1 | 2/2014 | Hung et al. | |
| 2014/0327022 | A1 | 11/2014 | Choi et al. | |
| 2015/0076505 | A1* | 3/2015 | Ke | H01L 33/005 |
| | | | | 438/29 |
| 2015/0214431 | A1 | 7/2015 | Chou et al. | |
| 2015/0311413 | A1* | 10/2015 | Chiu | H01L 33/44 |
| | | | | 257/98 |
| 2018/0337304 | A1* | 11/2018 | Fu | H01L 33/20 |
| 2019/0229238 | A1* | 7/2019 | Niwa | H01L 33/20 |
| 2019/0260179 | A1 | 8/2019 | Ueyama et al. | |

FOREIGN PATENT DOCUMENTS

| | | |
|---|---|---|
| CN | 104143595 | 11/2014 |
| CN | 104716242 | 6/2015 |
| CN | 109863610 | 6/2016 |
| CN | 109244222 | 1/2019 |
| JP | 2015173166 | 10/2015 |

* cited by examiner

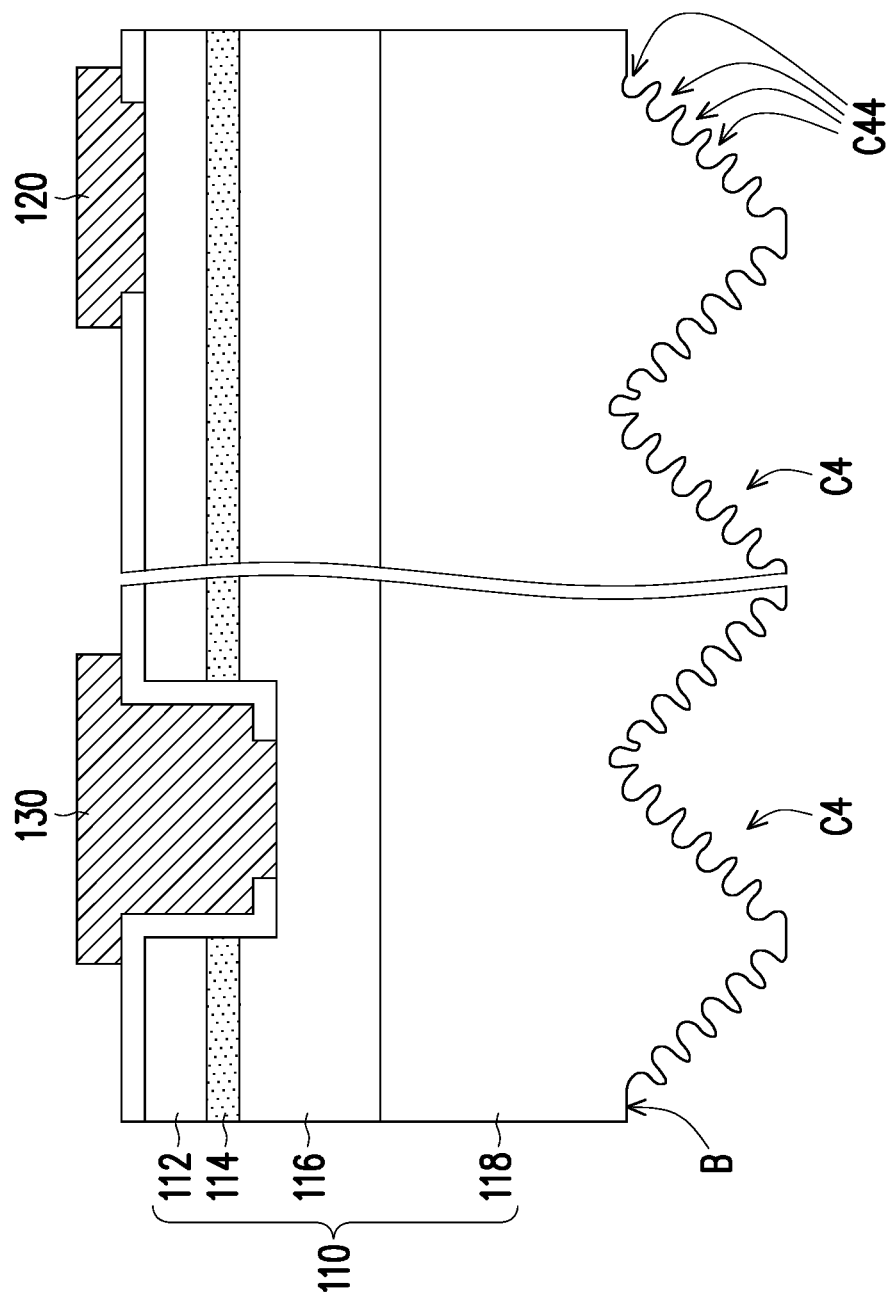

MICRO LIGHT-EMITTING DEVICE AND DISPLAY APPARATUS THEREOF

CROSS-REFERENCE TO RELATED APPLICATION

This application claims the priority benefit of Taiwan application serial no. 110118601, filed on May 24, 2021. The entirety of the above-mentioned patent application is hereby incorporated by reference herein and made a part of this specification.

BACKGROUND OF THE INVENTION

Field of the Invention

The invention relates to a semiconductor device, and more particularly to a micro light-emitting device and a display apparatus thereof.

Description of Related Art

At present, by making periodic patterned grooves on the surface of a micro light-emitting diode, the light-emitting angle of the medium is increased and the forward light-emitting efficiency of the micro light-emitting diode is increased. However, since the grooves all have the same shape, the light-emitting angle of the interface is fixed and limited, and thus the light-emitting angle of the medium cannot be effectively increased, and the front light-emitting efficiency of the micro light-emitting diode also may not be effectively improved.

SUMMARY OF THE INVENTION

The invention provides a micro light-emitting device that may provide a multi-angle light refraction surface to improve light-emitting efficiency.

The invention provides a micro light-emitting device display apparatus having better display quality.

A micro light-emitting device of the invention includes an epitaxial structure. The epitaxial structure has a bottom surface and includes a plurality of grooves, and the grooves are located on the bottom surface. Each of the grooves includes a plurality of sub-grooves, and the sub-grooves define an inner wall of each of the grooves. A ratio of a size of each of the grooves to a size of each of the sub-grooves is greater than 1 and less than or equal to 4000.

In an embodiment of the invention, the micro light-emitting device further includes a first-type electrode and a second-type electrode. The first-type electrode is disposed on the epitaxial structure. The second-type electrode is disposed on the epitaxial structure and separated from the first-type electrode and has different electrical properties from the first-type electrode. The epitaxial structure includes a first-type semiconductor layer, a second-type semiconductor layer, a light-emitting layer, and a buffer semiconductor layer. The first-type semiconductor layer is electrically connected to the first-type electrode. The second-type semiconductor layer is electrically connected to the second-type electrode. The light-emitting layer is disposed between the first-type semiconductor layer and the second-type semiconductor layer. The buffer semiconductor layer has a bottom surface and is disposed on a surface of the second-type semiconductor layer relatively far away from the light-emitting layer. The buffer semiconductor layer includes grooves.

In an embodiment of the invention, the buffer semiconductor layer has a first region and a second region surrounding the first region. A size of each of the sub-grooves located in the first region is different from a size of each of the sub-grooves located in the second region.

In an embodiment of the invention, a roughness of the bottom surface is less than a roughness of the first region, and the roughness of the first region is less than a roughness of the second region.

In an embodiment of the invention, in a direction away from the bottom surface toward an adjacent light-emitting layer, a roughness of the inner wall defined by the sub-grooves is greater.

In an embodiment of the invention, a ratio of a depth to a width of each of the sub-grooves is between 0.1 and 50.

In an embodiment of the invention, a ratio of an emission wavelength of the micro light-emitting device to a depth or a width of each of the sub-grooves is between 1 and 2000.

In an embodiment of the invention, the inner wall of each of the grooves is divided into at least one first region and at least one second region. A roughness of the first region is different from a roughness of the second region.

In an embodiment of the invention, an area range of the at least one first region and the at least one second region of one of the grooves is different from an area range of the first region and the second region of another of the grooves.

In an embodiment of the invention, a size of one of the grooves is different from a size of another of the grooves.

A micro light-emitting device display apparatus of the invention includes a display substrate and at least one micro light-emitting device. The micro light-emitting device is disposed on the display substrate and electrically connected to the display substrate. The micro light-emitting device includes an epitaxial structure. The epitaxial structure has a bottom surface and includes a plurality of grooves, and the grooves are located on the bottom surface. Each of the grooves includes a plurality of sub-grooves, and the sub-grooves define an inner wall of each of the grooves. A ratio of a size of each of the grooves to a size of each of the sub-grooves is greater than 1 and less than or equal to 4000.

An epitaxial structure of the invention includes a first-type semiconductor layer, a second-type semiconductor layer, a light-emitting layer and a buffer semiconductor layer. The second-type semiconductor layer is disposed on the first-type semiconductor layer. The light-emitting layer is disposed between the first-type semiconductor layer and the second-type semiconductor layer. The buffer semiconductor layer is disposed on a surface of the second-type semiconductor layer relatively far away from the light-emitting layer, wherein the buffer semiconductor layer has a bottom surface and comprises a plurality of grooves, the grooves are located on the bottom surface, each of the grooves comprises a plurality of sub-grooves, the sub-grooves define an inner wall of each of the grooves, and a ratio of a size of each of the grooves to a size of each of the sub-grooves is greater than 1 and less than or equal to 4000.

In an embodiment of the invention, the buffer semiconductor layer has a first region and a second region surrounding the first region. A size of each of the sub-grooves located in the first region is different from a size of each of the sub-grooves located in the second region.

Based on the above, in the design of the micro light-emitting device of the invention, the epitaxial structure is provided with a plurality of grooves on the bottom surface, and each of the grooves includes a plurality of sub-grooves, and these sub-grooves may define the inner wall of each of the grooves, wherein the ratio of the size of each of the grooves to the size of each of the sub-grooves is greater than 1 and less than or equal to 4000. With this design, a multi-angle light refraction surface may be provided to improve the light-emitting efficiency of the micro light-emitting device, thereby improving the display quality of the micro light-emitting device display apparatus adopting the micro light-emitting device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a schematic cross-sectional view of a micro light-emitting device according to another embodiment of the invention.

DESCRIPTION OF THE EMBODIMENTS

Embodiments of the invention describe the structure of a micro light-emitting device (such as a micro LED) that is ready to be picked up and transferred onto a receiving substrate. The receiving substrate may be, for example, a display substrate, a light-emitting substrate, a substrate having functional devices such as transistors or integrated circuits (ICs), or other substrates having other circuits, but is not limited thereto. Although some embodiments of the invention are specific to describing a micro LED including a p-n diode, it should be understood that the embodiments of the invention are not limited thereto, and certain embodiments may also be applied to other micro light-emitting devices, and such micro light-emitting devices are designed in such a way as to control the execution of predetermined electronic functions (e.g., diodes, transistors, integrated circuits) or photonic functions (LEDs, lasers).

Figure 1A:
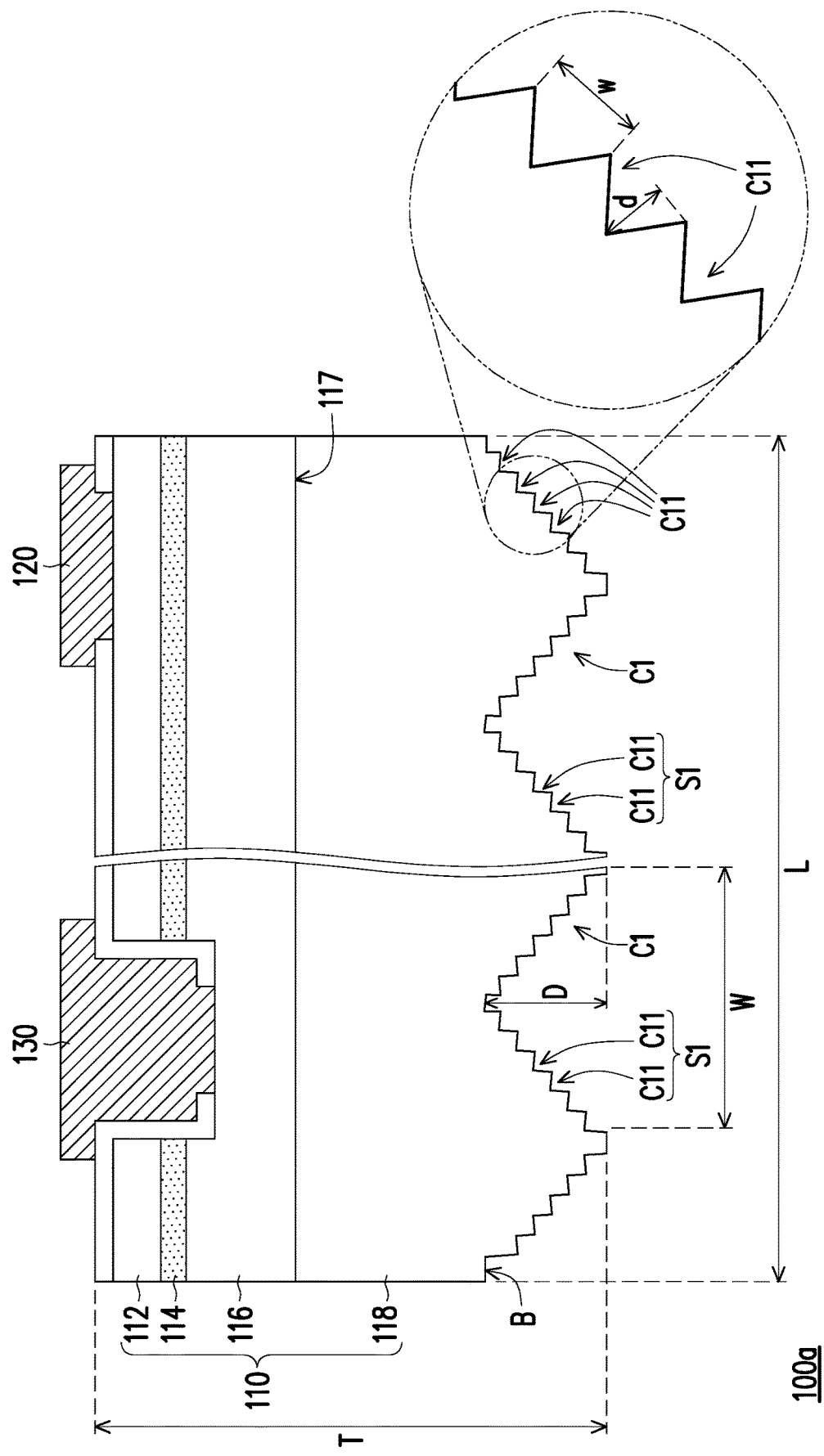
FIG. 1A is a schematic cross-sectional view of a micro light-emitting device according to an embodiment of the invention.
Figure 1B:
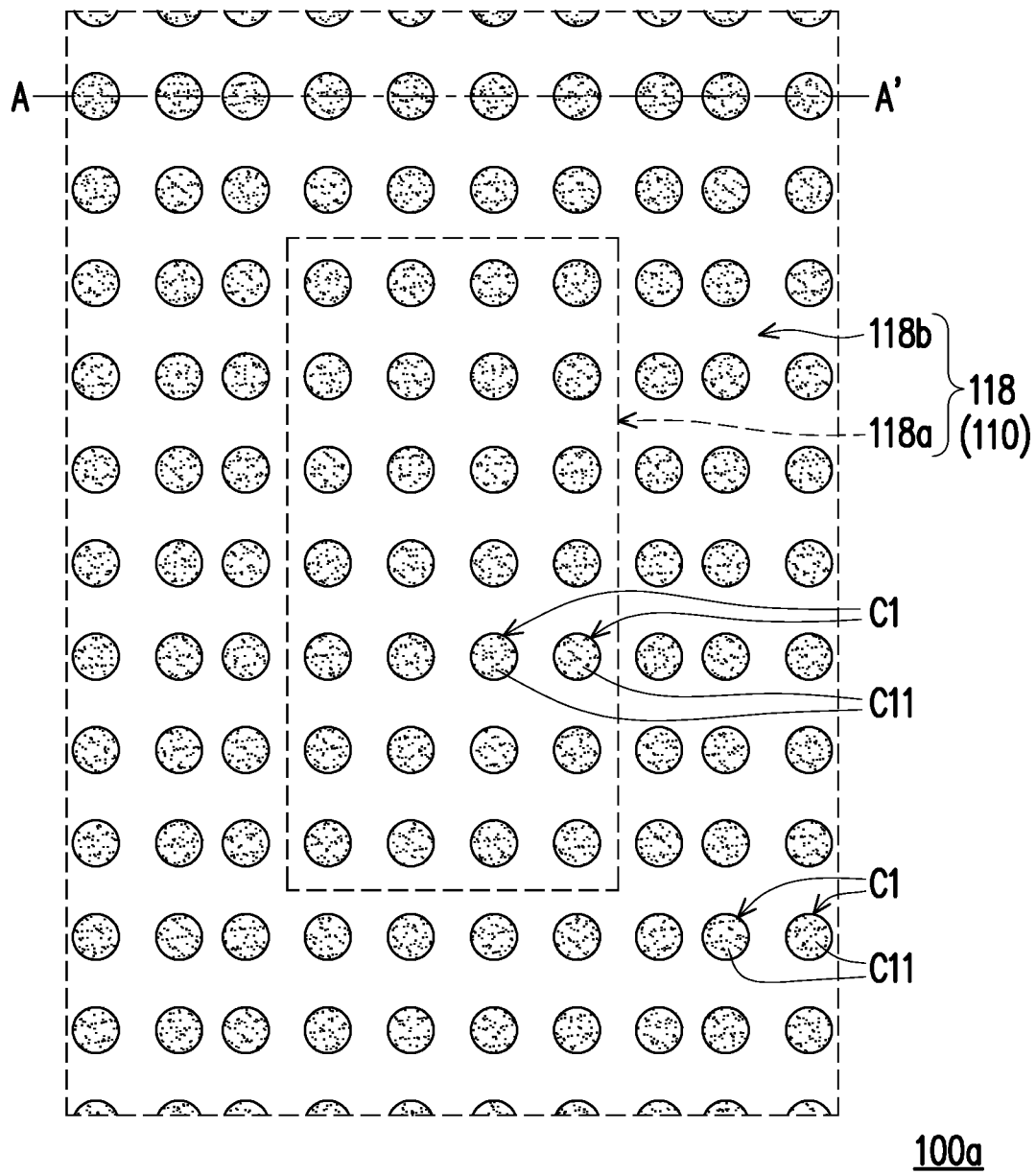
FIG. 1B is a schematic bottom view of the micro light-emitting device of FIG. 1A.

FIG. 1A is a schematic cross-sectional view of a micro light-emitting device according to an embodiment of the invention. FIG. 1B is a schematic bottom view of the micro light-emitting device of FIG. 1A. For the convenience of description, FIG. 1A is a schematic cross-sectional view along line A-A' of FIG. 1B. Referring to both FIG. 1A and FIG. 1B, in the present embodiment, a micro light-emitting device 100a includes an epitaxial structure 110, a first-type electrode 120, and a second-type electrode 130. The epitaxial structure 110 has a bottom surface B and includes a plurality of grooves C1, and the grooves C1 are located on the bottom surface B. Each of the grooves C1 includes a plurality of sub-grooves C11, and the sub-grooves C11 define an inner wall S1 of each of the grooves C1. The first-type electrode 120 is disposed on the epitaxial structure 110. The second-type electrode 130 is disposed on the epitaxial structure 110 and separated from the first-type electrode 120 and has different electrical properties from the first-type electrode 120. In particular, the ratio of the size of each of the grooves C1 to the size of each of the sub-grooves C11 is greater than 1 and less than or equal to 4000.

Specifically, in the present embodiment, the epitaxial structure 110 includes a first-type semiconductor layer 112, a second-type semiconductor layer 116, a light-emitting layer 114, and a buffer semiconductor layer 118. The first-type semiconductor layer 112 is electrically connected to the first-type electrode 120, and the first-type semiconductor layer 112 is, for example, a P-type semiconductor layer. The second-type semiconductor layer 116 is electrically connected to the second-type electrode 130, and the second-type semiconductor layer 116 is, for example, an N-type semiconductor layer. The light-emitting layer 114 is disposed between the first-type semiconductor layer 112 and the second-type semiconductor layer 116. The buffer semiconductor layer 118 has the bottom surface B and is disposed on a surface 117 of the second-type semiconductor layer 116 relatively far away from the light-emitting layer 114. Here, the buffer semiconductor layer 118 includes the grooves C1, wherein the cross-sectional shape of each of the grooves C1 is, for example, a cone shape, and the cross-sectional shape of each of the sub-grooves C11 is also, for example, a cone shape, but is not limited thereto. In other words, the bottom surface B of the buffer semiconductor layer 118 of the present embodiment is a non-flat surface that may provide a multi-angle light refraction surface and reduce the total reflection of emitted light. In other embodiments, the cross-sectional shape of each of the grooves C1 is, for example, a platform shape, a column shape, or other suitable shapes. The first-type electrode 120 and the second-type electrode 130 are located on the same side of the second-type semiconductor layer 116 opposite to the light exit surface. That is, the micro light-emitting device 100a of the present embodiment is embodied as a flip-chip micro light-emitting diode. The buffer semiconductor layer 118 is, for example, an undoped semiconductor layer that may be used as a buffer during epitaxial growth.

Furthermore, referring to FIG. 1B again, the buffer semiconductor layer 118 of the present embodiment has a first region 118a and a second region 118b surrounding the first region 118a. Here, the first region 118a and the second region 118b may be disposed with the same geometric center, which is not limited here. The size of each of the sub-grooves C11 located in the first region 118a is equal to the size of each of the sub-grooves C11 located in the second region 118b. Here, the size mentioned refers to depth or width. In the present embodiment, at least one of a depth d and a width w of each of the sub-grooves C11 is, for example, greater than 0 and less than 500 nm. Preferably, at least one of the depth d and the width w of each of the sub-grooves C11 is greater than or equal to 5 nm and less than or equal to 300 nm, so that the micro light-emitting device 100a has better light-emitting efficiency. Furthermore, the ratio of the depth w to the width d of each of the sub-grooves C11 in the present embodiment is, for example, between 0.1 and 50, so that the micro light-emitting device 100a may have better light-emitting efficiency. In the present embodiment, the roughness of the inner wall S1 defined by the sub-grooves C11 is, for example, greater than 0 and less than 500 nm, wherein the roughness is embodied as arithmetic average roughness (Ra), to provide the micro light-emitting device 100a with better light-emitting efficiency. Here, each of the sub-grooves C11 has similar size and shape, but is not limited thereto.

As shown in FIG. 1A, in the present embodiment, in each of the grooves C1, the sub-grooves C11 are arranged in a regular periodic pattern. Preferably, the ratio of the size (including a depth D and a width W) and the roughness of each of the grooves C1 to the size of each of the sub-grooves C11 is between 1 and 4000. In order to make the micro light-emitting device 100a have better light-emitting efficiency, please refer to FIG. 1A and FIG. 1B at the same time. The ratio of a maximum length L of the epitaxial structure 110 to the size of each of the sub-grooves C11 of the present embodiment is, for example, between 1 and 120000. The ratio of a thickness T of the epitaxial structure 110 to the size of each of the sub-grooves C11 is, for example, between 1 and 20000. In addition, the ratio of the emission wavelength of the micro light-emitting device 110a of the present embodiment to the size of each of the sub-grooves C11 is, for example, between 1 and 2000.

In short, in the design of the micro light-emitting device 100a of the present embodiment, the epitaxial structure 110 is provided with the plurality of grooves C1 on the bottom surface B, and each of the grooves C1 includes the plurality of sub-grooves C11. These sub-grooves C11 may define the inner wall S1 of each of the grooves C1. In other words, the light exit surface of the micro light-emitting device 100a of the present embodiment is substantially defined by the grooves C1 with a greater size and the sub-grooves C11 with a smaller size on the surface thereof. With this design, a multi-angle light refraction surface may be provided, and the light-emitting efficiency of the micro light-emitting device 100a may be improved.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 2A:
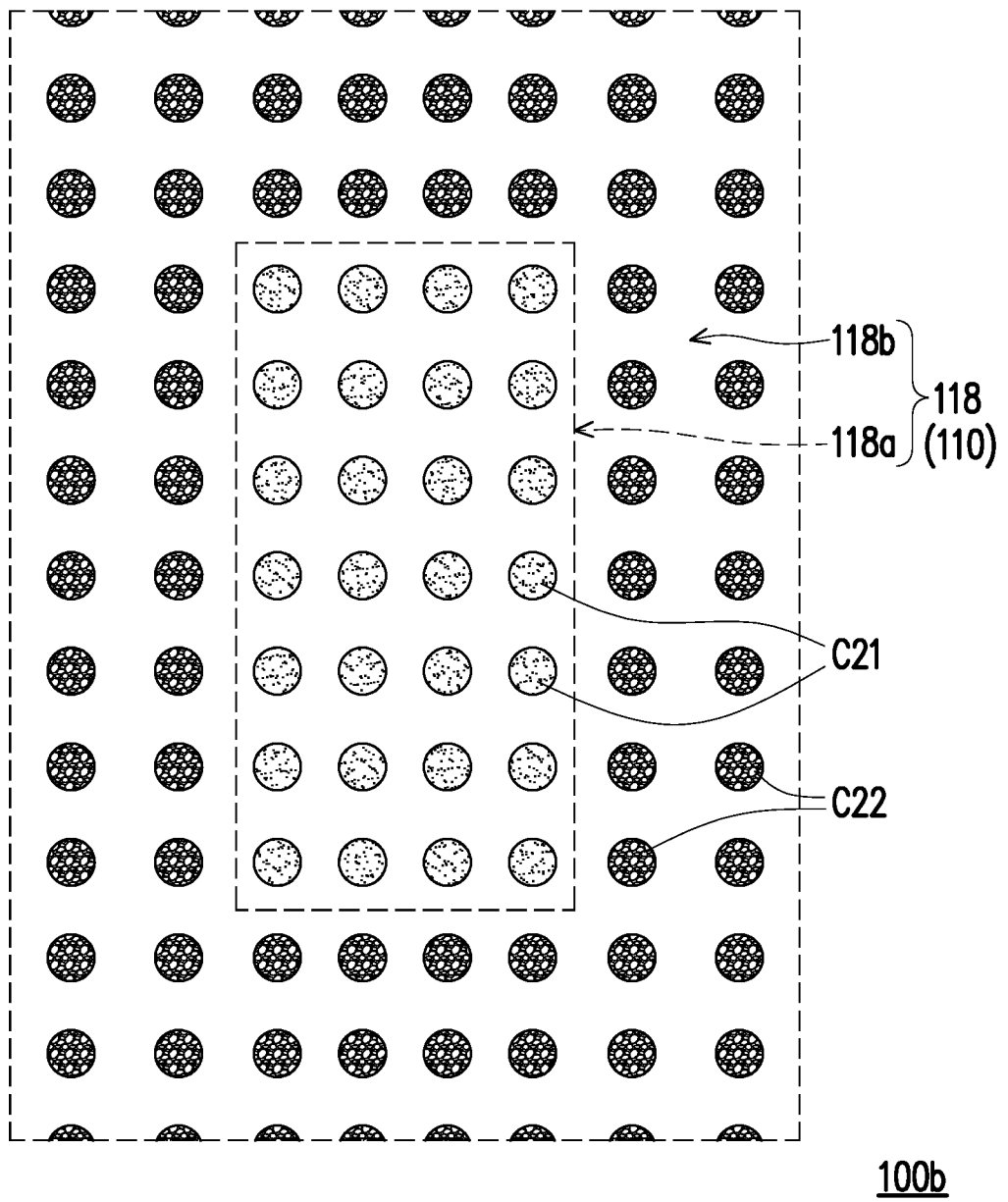
FIG. 2A is a schematic bottom view of a micro light-emitting device according to another embodiment of the invention.
Figure 2B:
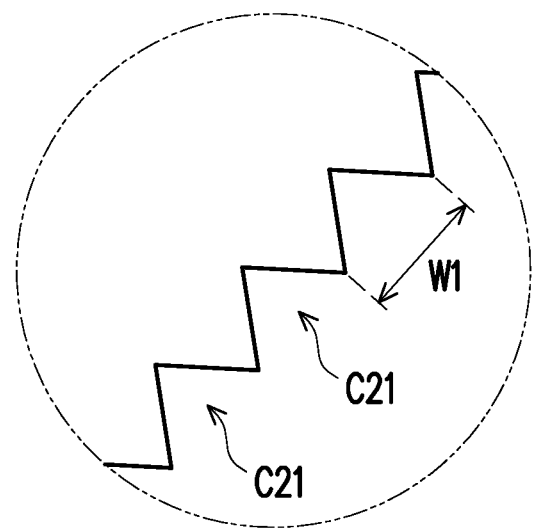
FIG. 2B and FIG. 2C are respectively partial cross-sectional schematic diagrams of the sub-grooves in FIG. 2A.
Figure 2C:
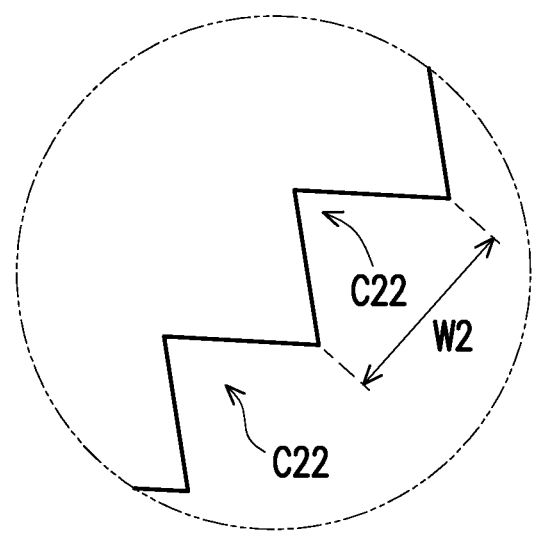

FIG. 2A is a schematic bottom view of a micro light-emitting device according to another embodiment of the invention. FIG. 2B and FIG. 2C are respectively partial cross-sectional schematic diagrams of the sub-grooves in FIG. 2A. Please refer to FIGS. 1A, 1B, 2A, 2B, and 2C at the same time. A micro light-emitting device 100b of the present embodiment is similar to the micro light-emitting device 100a of FIG. 1B, and the difference between the two is: in the present embodiment, the size of each of sub-grooves C21 located in the first region 118a of the buffer semiconductor layer 118 is less than the size of each of sub-grooves C22 located in the second region 118b of the buffer semiconductor layer 118. Here, a width W1 of each of the sub-grooves C21 located in the first region 118a of the buffer semiconductor layer 118 is less than a width W2 of each of the sub-grooves C22 located in the second region 118b of the buffer semiconductor layer 118, and the light shape distribution of the light may be adjusted according to the application requirements of different products. Here, a depth d1 of each of the sub-grooves C21 located in the first region 118a of the buffer semiconductor layer 118 may be less than a depth d2 of each of the sub-grooves C22 located in the second region 118b of the buffer semiconductor layer 118, and the light shape distribution of the light may be adjusted according to the application requirements of different products. This design may also be applied to a design of the epitaxial structure before separation at the wafer stage to compensate for the difference in luminous efficiency of different areas on the wafer due to the limitation of epitaxial or device process capability. By adjusting the roughness of a specific area range or the size of the sub-grooves, the uniformity of the final light-emitting efficiency of the entire wafer may be improved.

Figure 2D:
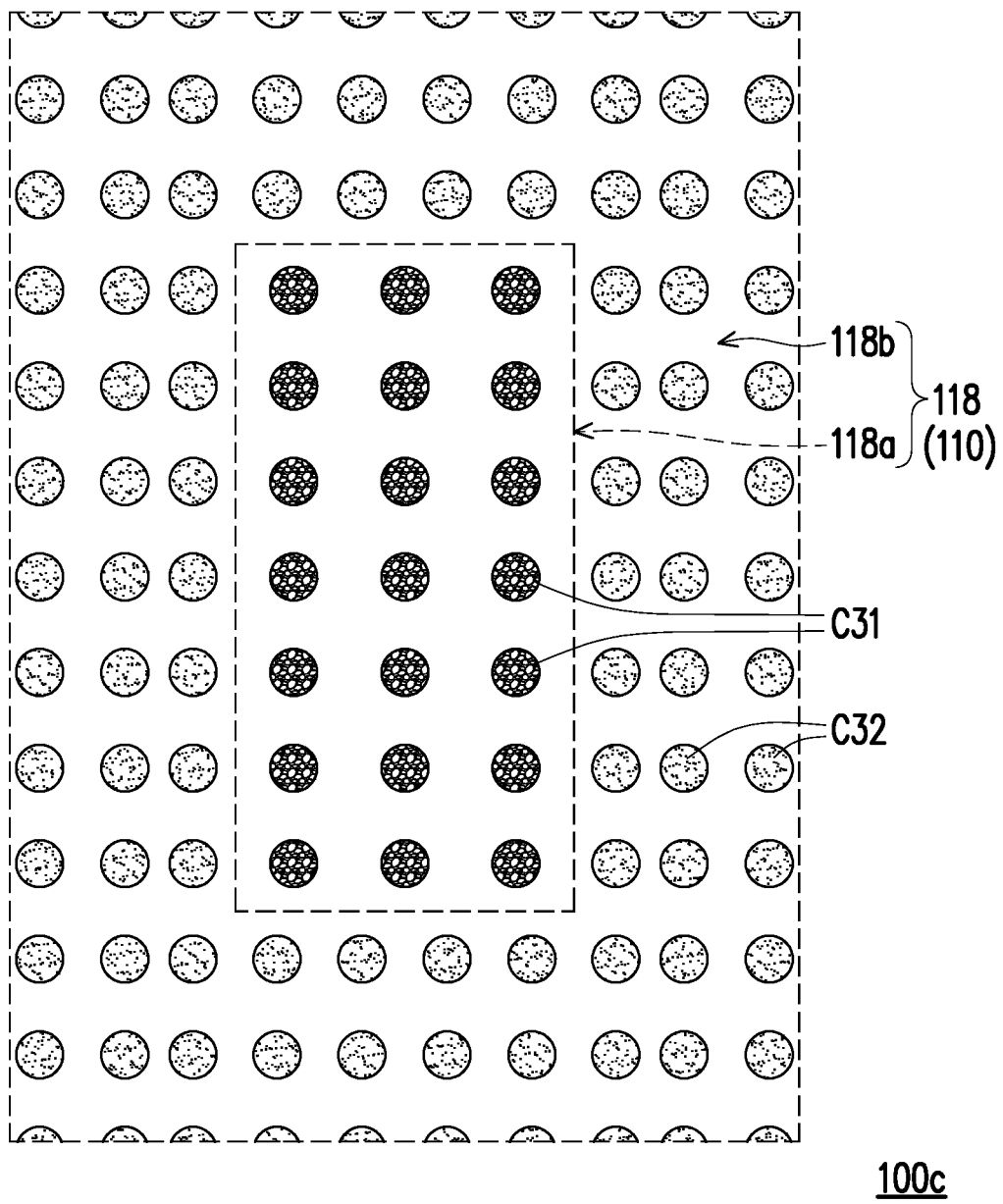
FIG. 2D is a schematic bottom view of a micro light-emitting device according to another embodiment of the invention.
Figure 2E:
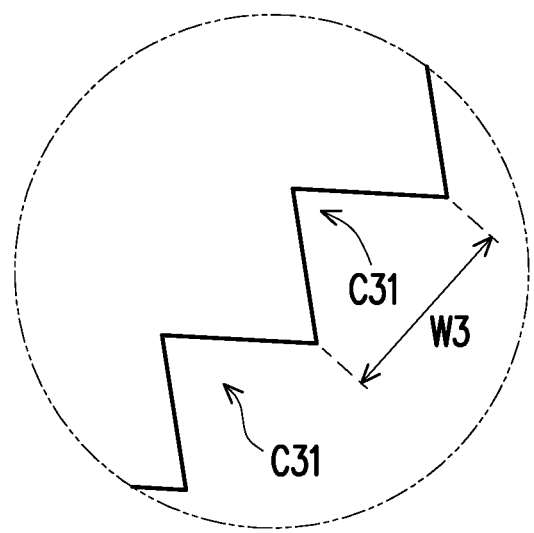
FIG. 2E and FIG. 2F are respectively partial cross-sectional schematic diagrams of the sub-grooves in FIG. 2D.
Figure 2F:
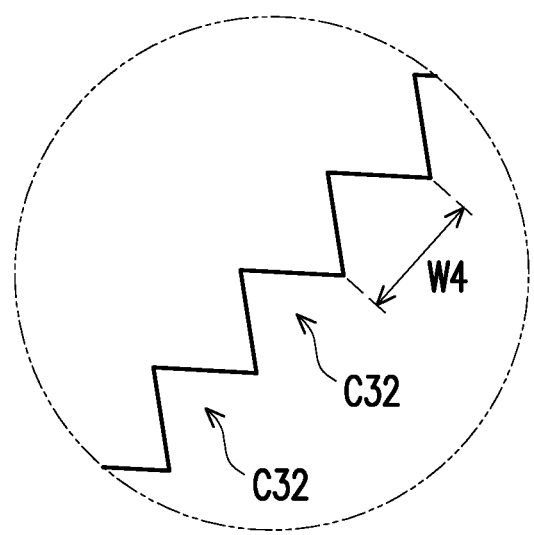

FIG. 2D is a schematic bottom view of a micro light-emitting device according to another embodiment of the invention. FIG. 2E and FIG. 2F are respectively partial cross-sectional schematic diagrams of the sub-grooves in FIG. 2D. Please refer to FIGS. 1A, 1B, 2D, 2E, and 2F at the same time. A micro light-emitting device 100c of the present embodiment is similar to the micro light-emitting device 100a of FIG. 1B, and the difference between the two is: the size of each of sub-grooves C31 located in the first region 118a of the buffer semiconductor layer 118 is greater than the size of each of sub-grooves C32 located in the second region 118b of the buffer semiconductor layer 118. Here, a width W3 of each of the sub-grooves C31 located in the first region 118a of the buffer semiconductor layer 118 is greater than a width W4 of each of the sub-grooves C32 located in the second region 118b of the buffer semiconductor layer 118, and the light shape distribution of the light may be adjusted according to the application requirements of different products. Here, a width d3 of each of the sub-grooves C31 located in the first region 118a of the buffer semiconductor layer 118 is greater than a width d4 of each of the sub-grooves d32 located in the second region 118b of the buffer semiconductor layer 118, and the light shape distribution of the light may be adjusted according to the application requirements of different products. This design may also be applied to a design of the epitaxial structure before separation at the wafer stage to compensate for the difference in luminous efficiency of different areas on the wafer due to the limitation of epitaxial or device process capability. By adjusting the roughness of a specific area range or the size of the sub-grooves, the uniformity of the final light-emitting efficiency of the entire wafer may be improved.

FIG. 3A is a schematic cross-sectional view of a micro light-emitting device according to another embodiment of the invention. Please refer to FIG. 1A and FIG. 3A at the same time. A micro light-emitting device 100d of the present embodiment is similar to the micro light-emitting device 100a of FIG. 1A, and the difference between the two is: in the present embodiment, the cross-sectional shape of each of grooves C4 is, for example, a cone shape, and the cross-sectional shape of each of sub-grooves C44 is, for example, an arc shape, but are not limited thereto.

Figure 3B:
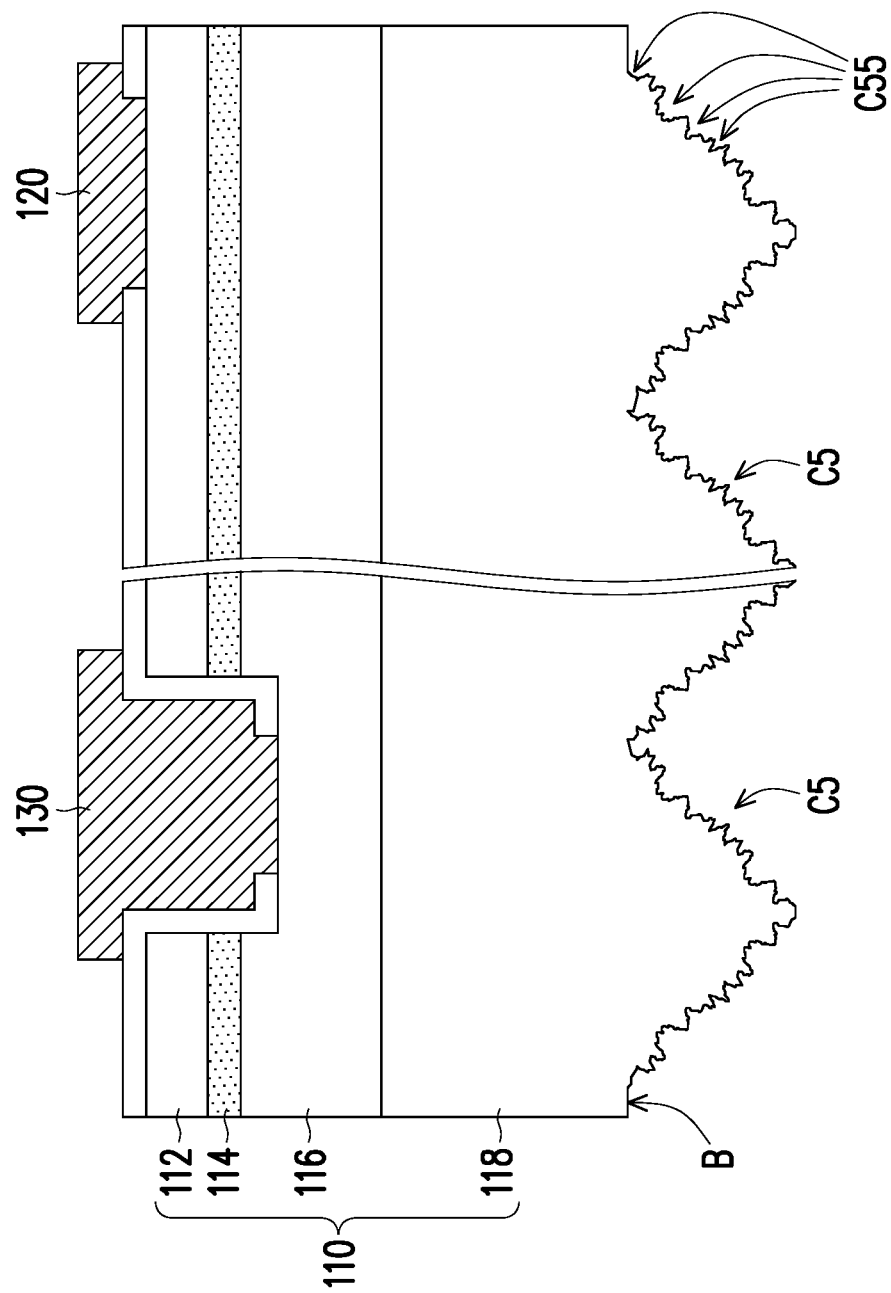
FIG. 3B is a schematic cross-sectional view of a micro light-emitting device according to another embodiment of the invention.

FIG. 3B is a schematic cross-sectional view of a micro light-emitting device according to another embodiment of the invention. Please refer to FIG. 1A and FIG. 3B at the same time. A micro light-emitting device 100e of the present embodiment is similar to the micro light-emitting device 100a of FIG. 1A, and the difference between the two is: in the present embodiment, the cross-sectional shape of each of grooves C5 is, for example, a cone shape, and sub-grooves C55 are arranged in an irregular pattern, with a greater angled irregular bottom surface, to achieve better light-emitting efficiency.

Figure 4A:
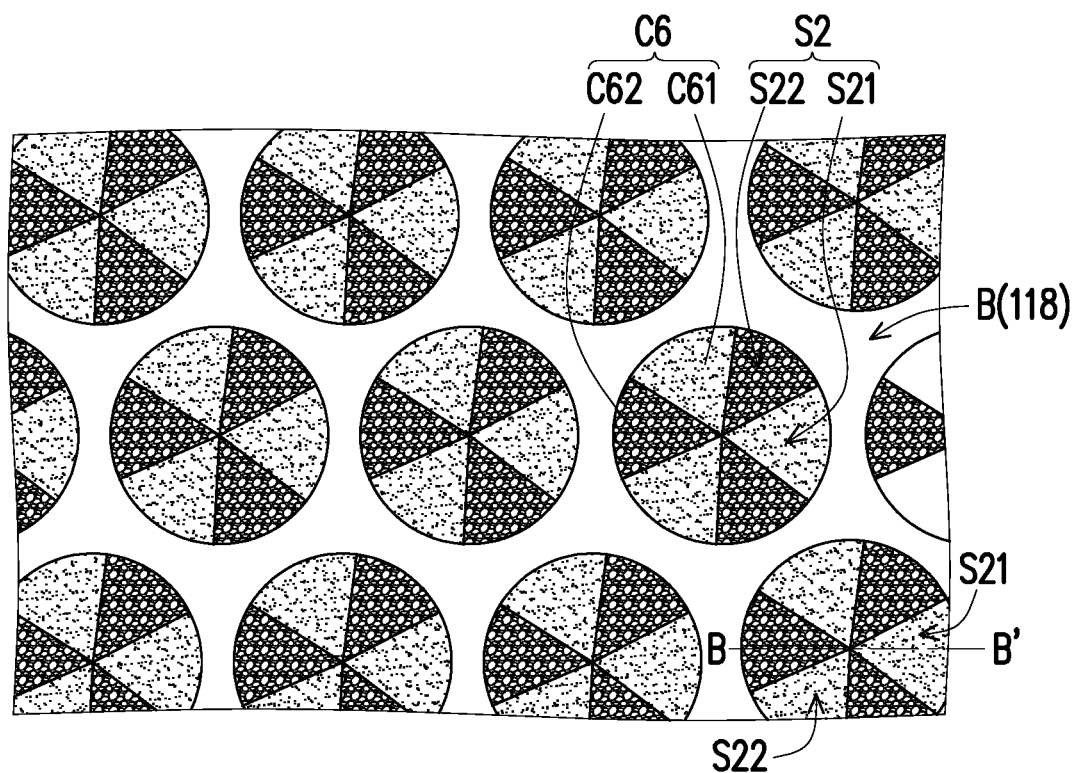
FIG. 4A is a schematic partial bottom view of a micro light-emitting device according to another embodiment of the invention.
Figure 4B:
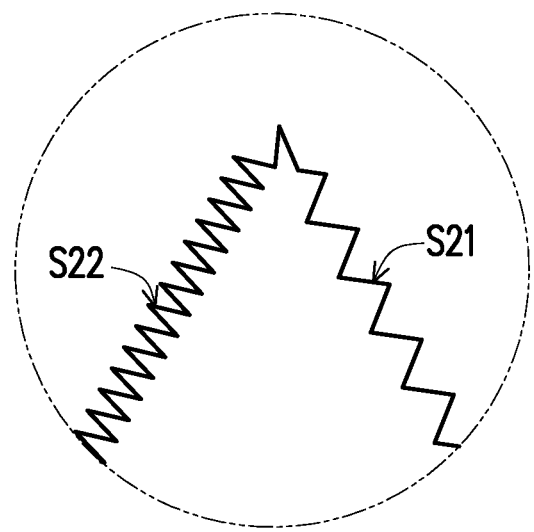
FIG. 4B is a schematic cross-sectional view along line B-B' in FIG. 4A.

FIG. 4A is a schematic partial bottom view of a micro light-emitting device according to another embodiment of the invention. FIG. 4B is a schematic cross-sectional view along line B-B' in FIG. 4A. Please refer to FIG. 1B, FIG. 4A, and FIG. 4B at the same time. A micro light-emitting device 100f of the present embodiment is similar to the micro light-emitting device 100a of FIG. 1B, and the difference between the two is: in the present embodiment, an inner wall S2 of each of grooves C6 is divided into a plurality of first regions S21 and a plurality of second regions S22, and the first regions S21 and the second regions S22 are arranged crosswise, such as in an approximately fan-shaped arrangement. The roughness of the first regions S21 defined by sub-grooves C61 is different from the roughness of the second regions S22 defined by sub-grooves C62 to achieve better light-emitting efficiency. Here, the roughness of the bottom surface B of the buffer semiconductor layer 118 is, for example, 0.2 nm to 0.5 nm. The roughness of the first regions S21 is, for example, 20 nm to 30 nm, and the roughness of the second regions S22 is, for example, 100 nm to 120 nm. In other words, the roughness of the bottom surface B here is less than the roughness of the first regions S21, and the roughness of the first regions S21 is less than the roughness of the second regions S22, so that light may be more easily refracted and emitted.

Figure 4C:
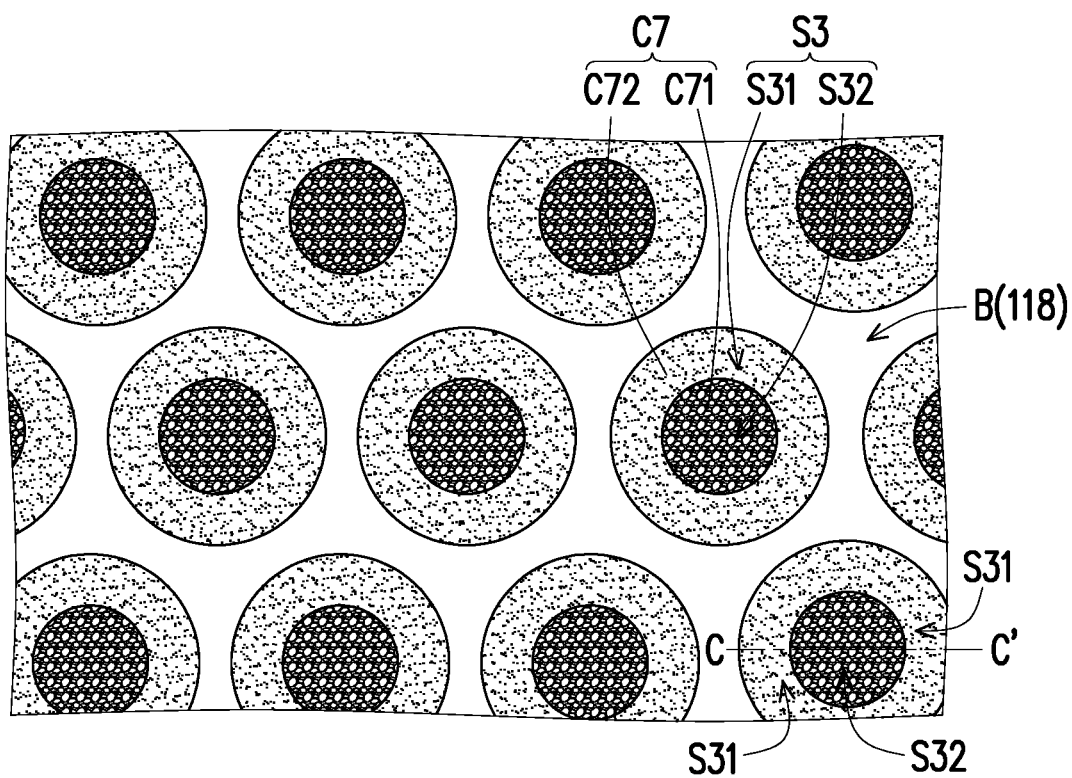
FIG. 4C is a schematic partial bottom view of a micro light-emitting device according to another embodiment of the invention.
Figure 4D:
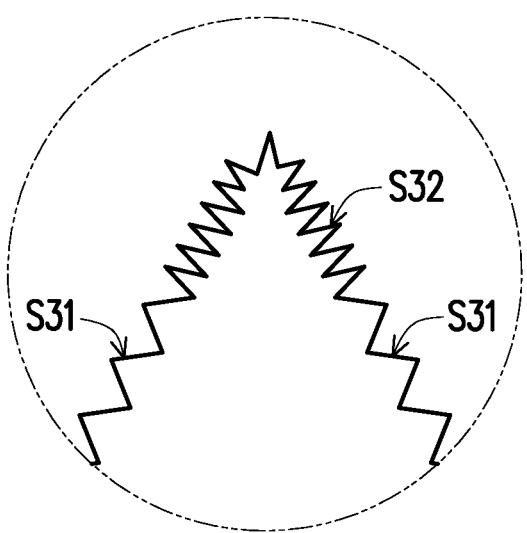
FIG. 4D is a schematic cross-sectional view along line C-C' in FIG. 4C.

FIG. 4C is a schematic partial bottom view of a micro light-emitting device according to another embodiment of the invention. FIG. 4D is a schematic cross-sectional view along line C-C' in FIG. 4C. Referring to FIG. 4A, FIG. 4B, FIG. 4C, and FIG. 4D at the same time, a micro light-emitting device 100g of the present embodiment is similar to the micro light-emitting device 100f of FIG. 4A, and the difference between the two is: in the present embodiment, each of the grooves C7 includes a sub-groove C71 and a sub-groove C72, and a first region S31 of an inner wall S3 of a groove C7 surrounds a second region S32, wherein the roughness of the first region S31 is different from the roughness of the second region S32 to achieve better light-emitting efficiency. Here, the roughness of the first region S31 is, for example, 20 nm to 30 nm, and the roughness of the second region S32 is, for example, 100 nm to 120 nm. In other words, the roughness of the bottom surface B here is less than the roughness of the first region S31, and the roughness of the first region S31 is less than the roughness of the second region S32, so that light may be more easily refracted and emitted from the center of the grooves. In other words, the roughness at the center of each of the grooves is greater than the roughness at the periphery. From the cross-section of FIG. 4D, the deeper the groove C7 and the rougher the inner wall formed by the arrangement of the sub-grooves S32 closer to the light-emitting layer 114, the better the light-emitting efficiency.

Figure 4E:
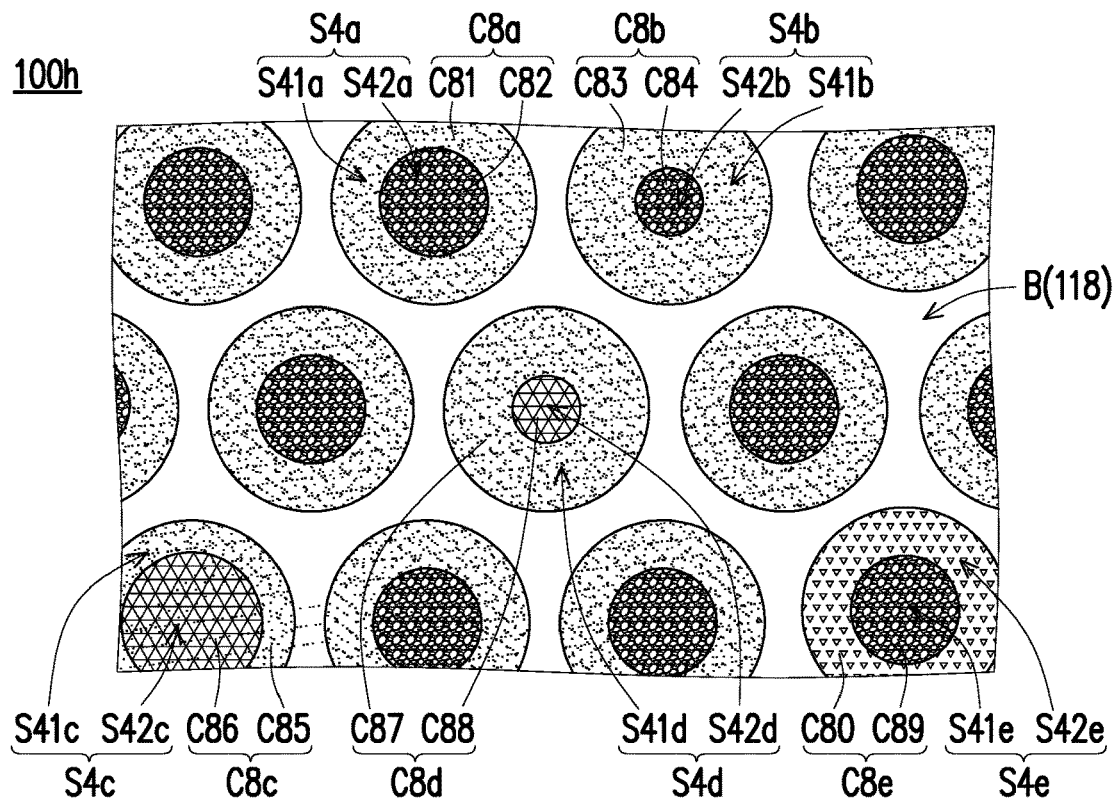
FIG. 4E is a schematic partial bottom view of a micro light-emitting device according to another embodiment of the invention.

FIG. 4E is a schematic partial bottom view of a micro light-emitting device according to another embodiment of the invention. Referring to all of FIG. 4C to FIG. 4E, a micro light-emitting device 100h of the present embodiment is similar to the micro light-emitting device 100g of FIG. 4C, and the difference between the two is: in the present embodiment, the roughnesses of the first regions and the second regions in grooves C8a, C8b, C8c, C8d, and C8e are all different. In detail, each of the grooves C8a includes a sub-groove C81 and a sub-groove C82, and the roughness of a first region S41a of an inner wall S4a of the groove C8a is different from the roughness of a second region S42a. Here, the roughness of the first region S41a is, for example, 20 nm to 40 nm, and the roughness of the second region S42a is, for example, 100 nm to 130 nm. In the groove C8b, each of the grooves C8b includes a sub-groove C83 and a sub-groove C84, and the roughness of a first region S41b of an inner wall S4b is different from the roughness of the second region S42a. Here, the roughness of the first region S41b is, for example, 20 nm to 40 nm, and the roughness of a second region S42b is, for example, 100 nm to 130 nm. Here, the area range of the groove C8a is the same as the area range of the groove C8b, but the area range of the second region S42a is greater than the area range of the second region S42b.

Moreover, in the groove C8c, each of the grooves C8c includes a sub-groove C85 and a sub-groove C86, and the roughness of a first region S41c of an inner wall S4c is different from the roughness of a second region S42c. Here, the roughness of the first region S41c is, for example, 20 nm to 40 nm, and the roughness of the second region S42c is, for example, 150 nm to 200 nm. In the groove C8d, each of the grooves C8d includes a sub-groove C87 and a sub-groove C88, and the roughness of a first region S41d of an inner wall S4d is different from the roughness of a second region S42d. Here, the roughness of the first region S41d is, for example, 20 nm to 40 nm, and the roughness of the second region S42d is, for example, 150 nm to 200 nm. Here, the area range of the groove C8c is the same as the area range of the groove C8d, but the area range of the second region S42c is greater than the area range of the second region S42d. Moreover, in the groove C8e, each of the grooves C8e includes a sub-groove C89 and a sub-groove C80, and the roughness of a first region S41e of an inner wall S4e is different from the roughness of a second region S42e. Here, the roughness of the first region S41e is, for example, 100 nm to 130 nm, and the roughness of the second region S42e is, for example, 40 nm to 60 nm.

In short, in the micro light-emitting device 100h of the present embodiment, the bottom surface B of the buffer semiconductor layer 118 and the grooves C8a, C8b, C8c, C8d, C8e thereof have at least five roughnesses, wherein the grooves C8a, C8b, C8c, C8d, and C8e have the same area range, but the first regions S41a, S41b, S41c, S41d, S41e and the second regions S42a, S42b, S42c, S42d, S42e in each of the grooves C8a, C8b, C8c, C8d, C8e do not all have the same area ranges. The different sizes of the first region and the second region of each of the grooves and the different roughnesses in the regions may result in more angles of light emission. It should be mentioned that, the roughness at the center of each of the grooves is greater than the roughness at the periphery. From the cross-section, the deeper the groove and the rougher the inner wall formed by the arrangement of the sub-grooves closer to the light-emitting layer 114, the better the light-emitting efficiency.

Figure 4F:
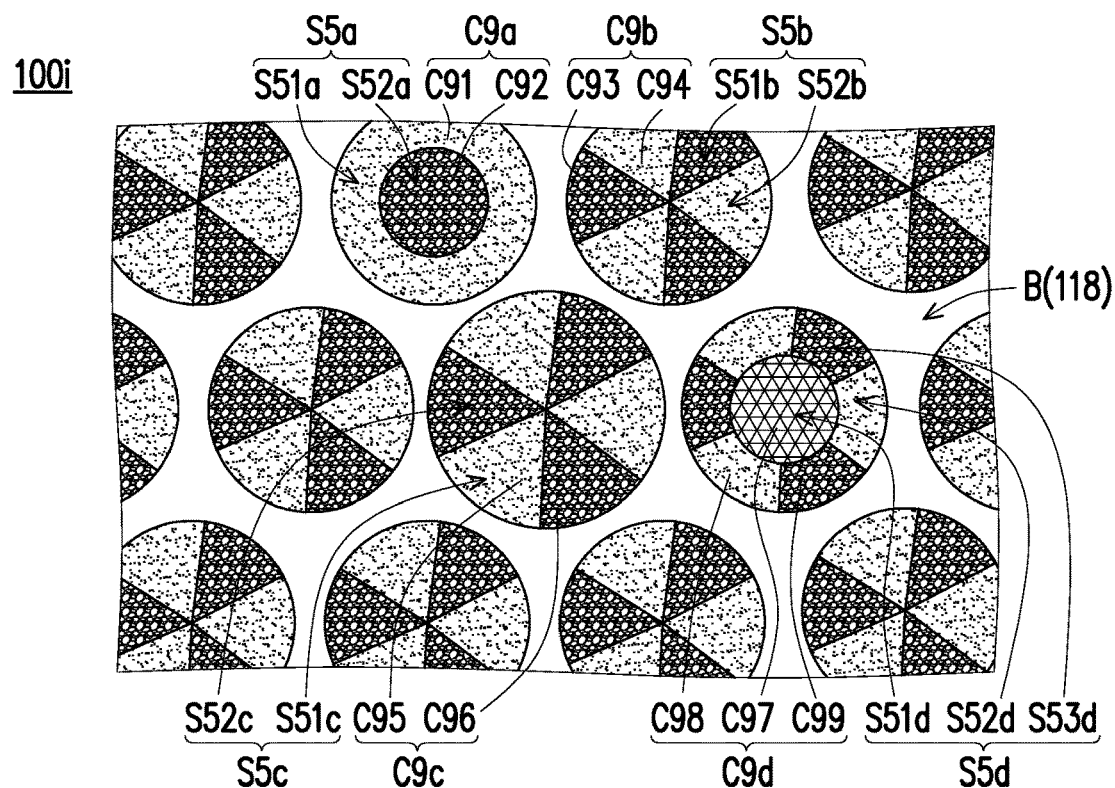
FIG. 4F is a schematic partial bottom view of a micro light-emitting device according to another embodiment of the invention.

FIG. 4F is a schematic partial bottom view of a micro light-emitting device according to another embodiment of the invention. Referring to all of FIG. 4E to FIG. 4F, a micro light-emitting device 100*i* of the present embodiment is similar to the micro light-emitting device 100*h* of FIG. 4E, and the difference between the two is: in the present embodiment, the dimensions of grooves C9*a*, C9*b*, C9*c*, and C9*d* are all different. In detail, each of the grooves C9*a* includes a sub-groove C91 and a sub-groove C92, and the roughness of a first region S51*a* of an inner wall S5*a* of the groove C9*a* is different from the roughness of a second region S52*a*. Here, the roughness of the first region S51*a* is, for example, 20 nm to 40 nm, and the roughness of the second region S52*a* is, for example, 100 nm to 130 nm. Each of the grooves C9*b* includes three sub-grooves C93 and three sub-grooves C94. First regions S51*b* and second regions S52*b* of an inner wall S5*b* of each of the grooves C9*b* are alternately arranged, such as in an approximately fan-shaped arrangement, wherein the roughness of the first regions S51*b* is different from the roughness of the second regions S52*b*. Here, the roughness of the first regions S51*b* is, for example, 100 nm to 130 nm, and the roughness of the second regions S52*b* is, for example, 20 nm to 40 nm.

Moreover, each of the grooves C9*c* includes three sub-grooves C95 and three sub-grooves C96, and first regions S51*c* and second regions S52*c* of an inner wall S5*c* of each of the grooves C9*c* are alternately arranged, such as in an approximately fan-shaped arrangement, wherein the roughness of the first regions S51*c* is different from the roughness of the second regions S52*c*. That is, the size of sub-grooves C95 is different from the size of sub-grooves C96. Here, the roughness of the first regions S51*c* is, for example, 20 nm to 40 nm, and the roughness of the second regions S52*c* is, for example, 100 nm to 130 nm. Each of the grooves C9*d* includes a sub-groove C97, three sub-grooves C98 and three sub-groove C99. An inner wall S5*d* of each of the grooves C9*d* is divided into one first region S51*d*, a plurality of second regions S52*d*, and a plurality of third regions S53*d*, wherein the first region S51*d* is, for example, an approximately circular shape, and the alternate arrangement of the second regions S52*d* and the third regions S53*d* is, for example, an approximately fan-shaped arrangement surrounding the first region S51*d* and concentric with the first region S51*d*. The roughness of the first region S51*d* is different from the roughness of the second regions S52*d* and the roughness of the third regions S53*d*. That is, the size of sub-grooves C97 is different from the size of sub-grooves C98 and the size of sub-grooves C99. Here, the roughness of the first region S51*d* is, for example, 150 nm to 200 nm. The roughness of the second regions S52*d* is, for example, 20 nm to 40 nm, and the roughness of the third regions S53*d* is, for example, 100 nm to 130 nm.

In short, in the micro light-emitting device 100*i* of the present embodiment, the bottom surface B of the buffer semiconductor layer 118 and the grooves C9*a*, C9*b*, C9*c*, and C9*d* thereof have at least four roughnesses, wherein the area ranges of the grooves C9*a*, C9*b*, and C9*d* are the same and less than the area range of the grooves C9*c*, and the area ranges of the first regions S51*a*, S51*b*, S51*c*, S51*d*, the second regions S52*a*, S52*b*, S52*c*, S52*d*, and the third regions S53*d* in each of the grooves C9*a*, C9*b*, C9*c*, C9*d* are not all the same. The different area ranges of each of the grooves, the different sizes of the first regions and the second regions of each of the grooves, and the different roughness in the regions may result in more angles of light emission. It should be mentioned that, the roughness at the center of each of the grooves is greater than the roughness at the periphery. From the cross-section, the deeper the grooves and the rougher the inner wall formed by the arrangement of the sub-grooves closer to the light-emitting layer 114, the better the light-emitting efficiency.

Figure 5:
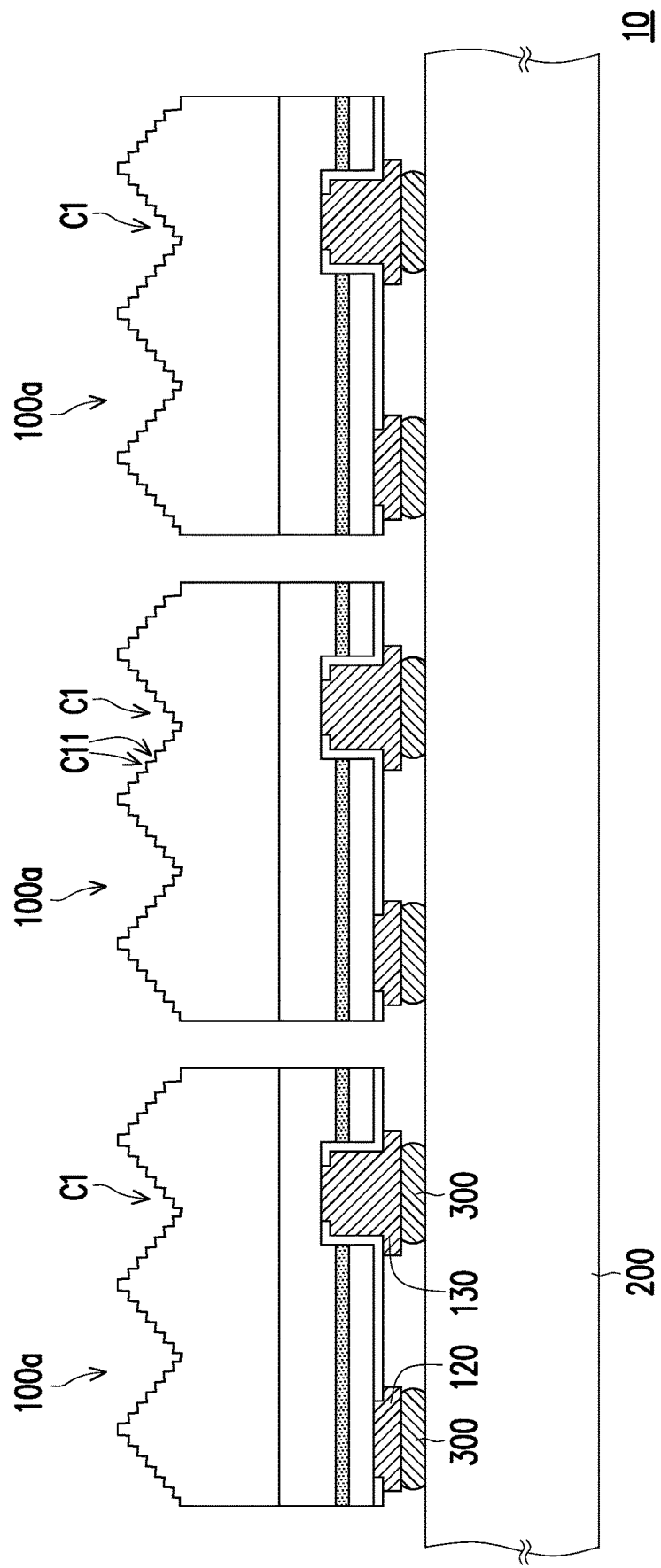
FIG. 5 is a cross-section of a micro light-emitting device display apparatus of an example of the invention.

FIG. 5 is a cross-section of a micro light-emitting device display apparatus of an example of the invention. Referring to FIG. 5, in the present embodiment, a micro light-emitting device display apparatus 10 includes a display substrate 200 and at least one micro light-emitting device (a plurality of the micro light-emitting device 100*a* in FIG. 1A are schematically shown). The micro light-emitting devices 100*a* are disposed on the display substrate 200, and the first-type electrodes 120 and the second-type electrodes 130 of the micro light-emitting devices 100*a* are electrically connected to the display substrate 200 via solder balls 300, respectively. Here, the display substrate 200 of the present embodiment is, for example, a complementary metal-oxide-semiconductor (CMOS) substrate, a liquid crystal-on-silicon (LCOS) substrate, a thin-film transistor (TFT) substrate, or other substrates having a working circuit, and is not limited herein. Here, the micro light-emitting devices may be a plurality of micro light-emitting devices emitting different light colors, such as red micro light-emitting devices, blue micro light-emitting devices, or green micro light-emitting devices. In an embodiment not shown, the sub-grooves of the micro light-emitting devices with different light colors may have different sizes. For example, a red micro light-emitting device with worse efficiency may have a greater size and a greater roughness to increase light-emitting efficiency, but is not limited thereto.

Figure 6A:
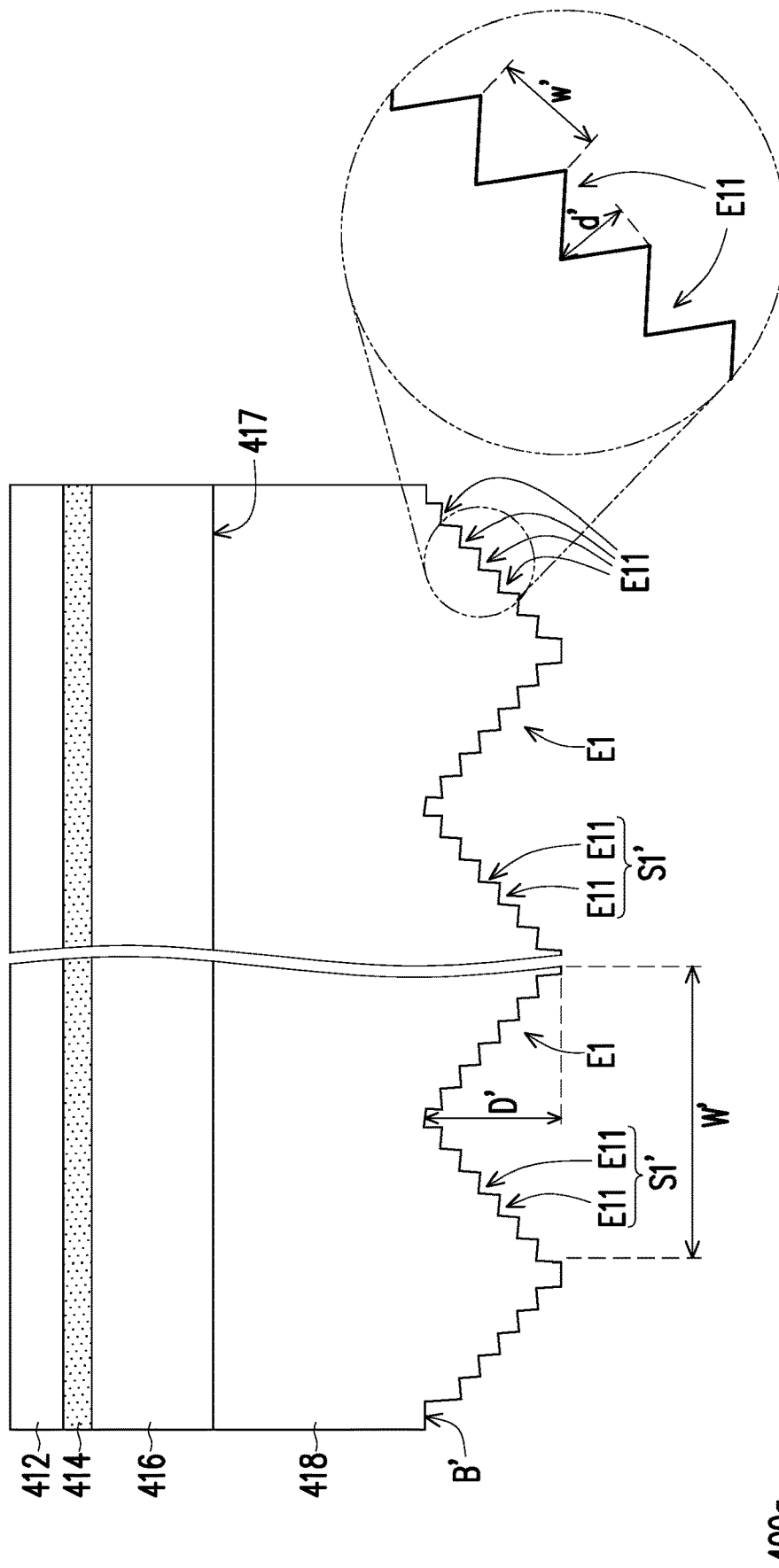
FIG. 6A is a cross-section of an epitaxial structure of an example of the invention.
Figure 6B:
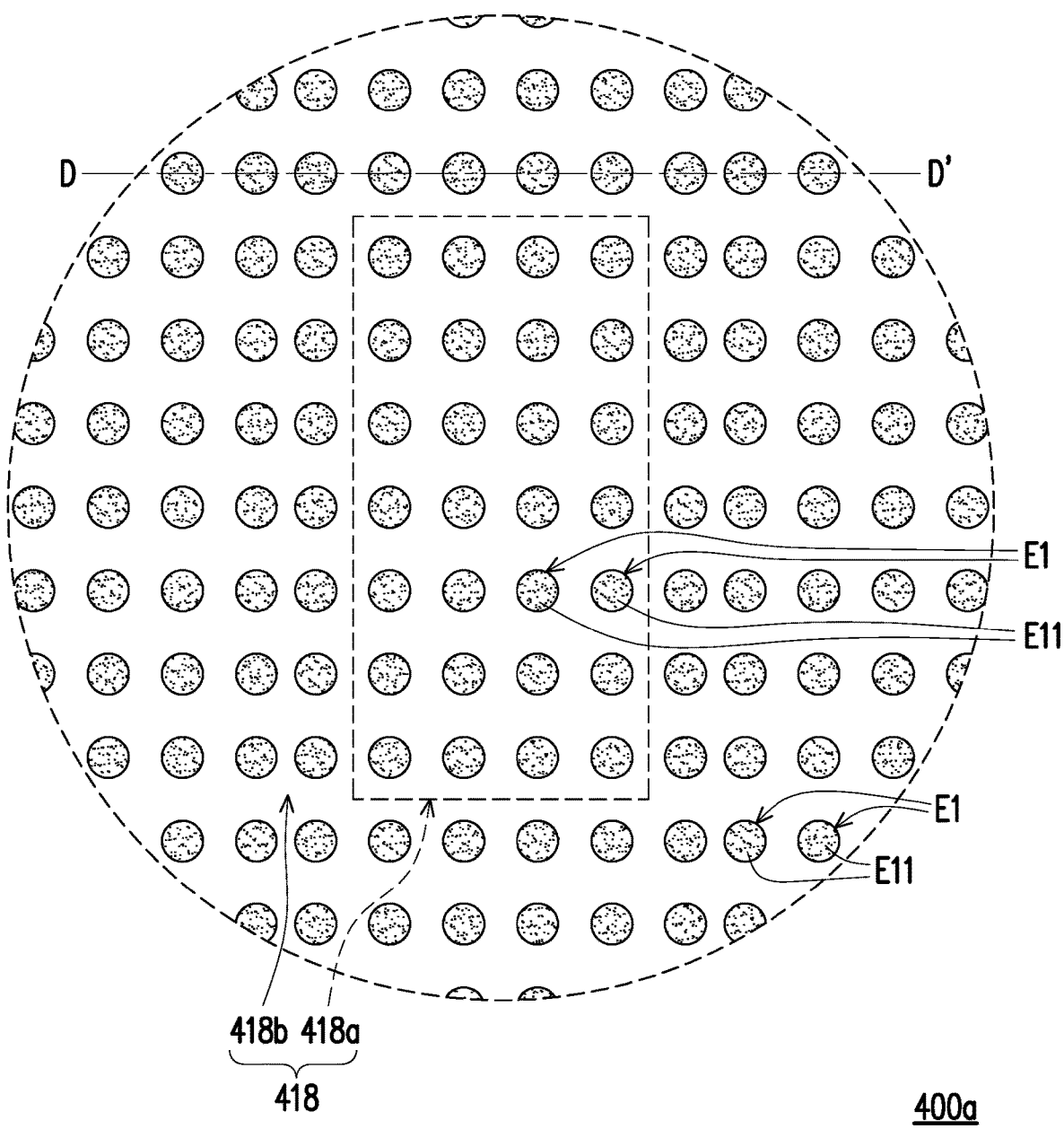
FIG. 6B is a schematic bottom view of the epitaxial structure of FIG. 6A.

FIG. 6A is a cross-section of an epitaxial structure of an example of the invention. FIG. 6B is a schematic bottom view of the epitaxial structure of FIG. 6A. For the convenience of description, FIG. 6A is a schematic cross-sectional view along line D-D' of FIG. 6B. Referring to both FIG. 6A and FIG. 6B, in the present embodiment, an epitaxial structure 400*a* of the present embodiment includes a first-type semiconductor layer 412, a light-emitting layer 414, a second-type semiconductor layer 416 and a buffer semiconductor layer 418. The second-type semiconductor layer 416 is disposed on the first-type semiconductor layer 412. The light-emitting layer 414 is disposed between the first-type semiconductor layer 412 and the second-type semiconductor layer 416. The buffer semiconductor layer 418 is disposed on a surface 417 of the second-type semiconductor layer 416 relatively far away from the light-emitting layer 414, wherein the buffer semiconductor layer 418 has a bottom surface B' and includes a plurality of grooves E1, the grooves E1 are located on the bottom surface B', each of the grooves E1 includes a plurality of sub-grooves E11, the sub-grooves E11 define an inner wall S1' of each of the grooves E1, and a ratio of a size of each of the grooves E1 to a size of each of the sub-grooves E11 is greater than 1 and less than or equal to 4000.

Specifically, in the present embodiment, the buffer semiconductor layer 418 of the present embodiment has a first region 418*a* and a second region 418*b* surrounding the first region 418*a*. Herein, the first region 418*a* and the second region 418*b* may be disposed with the same geometric center, which is not limited here. The size of each of the sub-grooves E11 located in the first region 418*a* is equal to the size of each of the sub-grooves E11 located in the second region 418b. In each of the grooves E1, the sub-grooves E11 are arranged in a regular periodic pattern. Preferably, the ratio of the size (including a depth D and a width W) and the roughness of each of the grooves E1 to the size of each of the sub-grooves E11 is between 1 and 4000.

In short, in the design of the epitaxial structure 400a of the present embodiment, the epitaxial structure 400a is provided with the plurality of grooves E1 on the bottom surface B', and each of the grooves E1 includes the plurality of sub-grooves E11. These sub-grooves E11 may define the inner wall S1' of each of the grooves E1. In other words, the light exit surface of the epitaxial structure 400a of the present embodiment is substantially defined by the grooves E1 with a greater size and the sub-grooves E11 with a smaller size on the surface thereof. With this design, a multi-angle light refraction surface may be provided, and the light-emitting efficiency of the epitaxial structure 400a may be improved.

Figure 7:
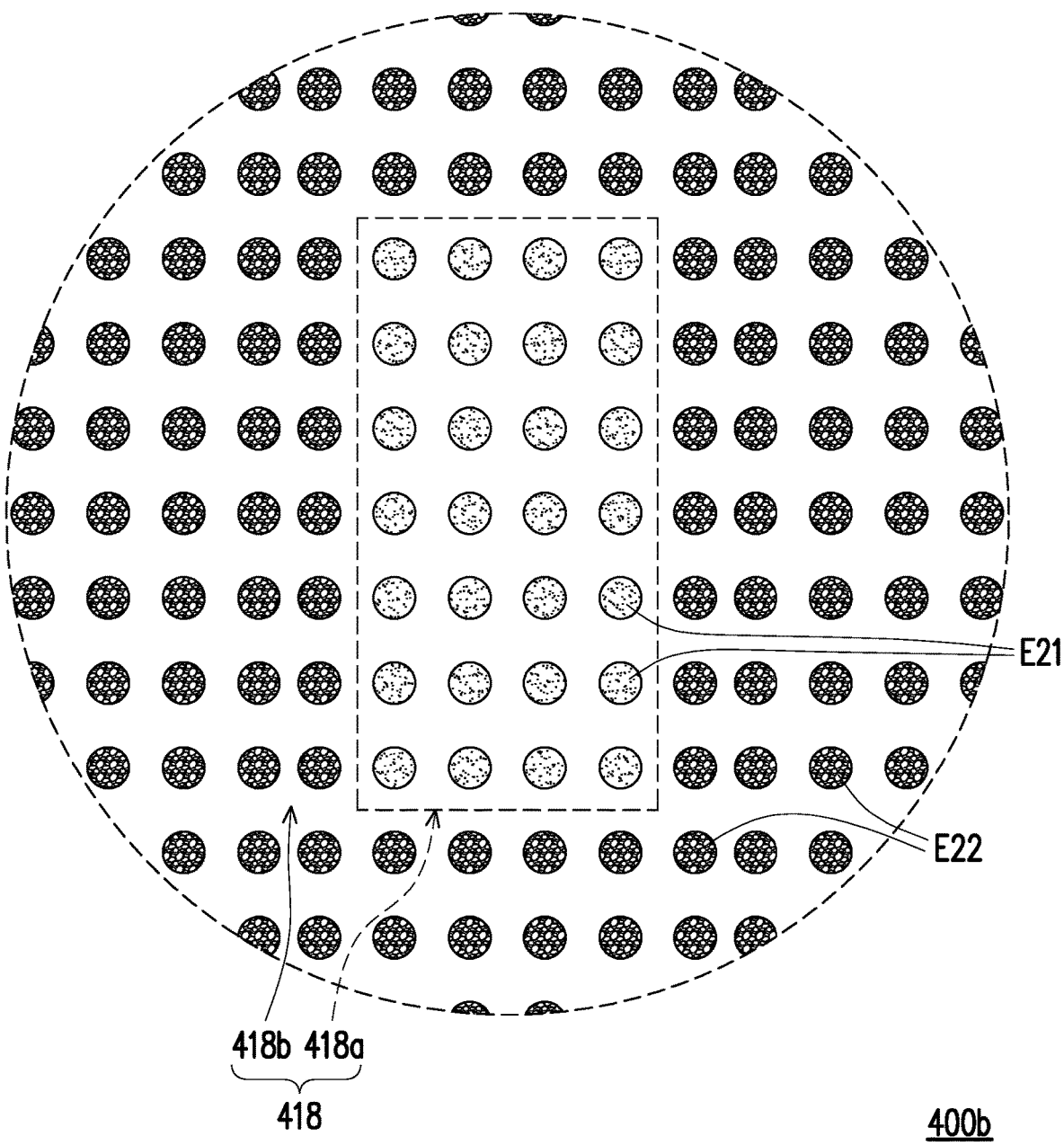
FIG. 7 is a schematic bottom view of an epitaxial structure according to another embodiment of the invention.

FIG. 7 is a schematic bottom view of an epitaxial structure according to another embodiment of the invention. Please refer to FIGS. 6A, 6B, and 7 at the same time. A epitaxial structure 400b of the present embodiment is similar to the epitaxial structure 400a of FIG. 6B, and the difference between the two is: in the present embodiment, the size of each of sub-grooves E21 located in the first region 418a of the buffer semiconductor layer 418 is less than the size of each of sub-grooves E22 located in the second region 418b of the buffer semiconductor layer 418. Herein, a width of each of the sub-grooves E21 located in the first region 418a of the buffer semiconductor layer 418 is less than a width of each of the sub-grooves E22 located in the second region 418b of the buffer semiconductor layer 418, and the light shape distribution of the light may be adjusted according to the application requirements of different products. Herein, a depth of each of the sub-grooves E21 located in the first region 418a of the buffer semiconductor layer 418 may be less than a depth of each of the sub-grooves E22 located in the second region 418b of the buffer semiconductor layer 418, and the light shape distribution of the light may be adjusted according to the application requirements of different products. In an embodiment not shown, the size of each of sub-grooves E21 located in the first region 418a of the buffer semiconductor layer 418 is greater than the size of each of sub-grooves E22 located in the second region 418b of the buffer semiconductor layer 418. In other word, the size of each of the sub-grooves E21 located in the first region 418a is different from the size of each of the sub-grooves E21 located in the second region 418b.

In short, the micro light-emitting device display apparatus 10 of the present embodiment provides a multi-angle light refraction surface via the grooves C1 of the micro light-emitting device 100a with the sub-grooves C11. Thereby, the light-emitting efficiency of the micro light-emitting device 100a is improved, and the display quality of the micro light-emitting device display apparatus 10 adopting the micro light-emitting device 100a is improved.

Based on the above, in the design of the micro light-emitting device of the invention, the epitaxial structure is provided with a plurality of grooves on the bottom surface, and each of the grooves includes a plurality of sub-grooves, and these sub-grooves may define the inner wall of each of the grooves, wherein the ratio of the size of each of the grooves to the size of each of the sub-grooves is greater than 1 and less than or equal to 4000. With this design, a multi-angle light refraction surface may be provided to improve the light-emitting efficiency of the micro light-emitting device, thereby improving the display quality of the micro light-emitting device display apparatus adopting the micro light-emitting device.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:
1. A micro light-emitting device, comprising:
an epitaxial structure having a bottom surface and comprising a plurality of grooves, wherein the grooves are located on the bottom surface, each of the grooves comprises a plurality of sub-grooves, the sub-grooves define an inner wall of each of the grooves, and a ratio of a size of each of the grooves to a size of each of the sub-grooves is greater than 1 and less than or equal to 4000;
a first-type electrode disposed on the epitaxial structure; and
a second-type electrode disposed on the epitaxial structure and separated from the first-type electrode and having different electrical properties from the first-type electrode;
wherein the epitaxial structure further comprises:
a first-type semiconductor layer electrically connected to the first-type electrode;
a second-type semiconductor layer electrically connected to the second-type electrode;
a light-emitting layer disposed between the first-type semiconductor layer and the second-type semiconductor layer; and
a buffer semiconductor layer having the bottom surface and disposed on a surface of the second-type semiconductor layer relatively far away from the light-emitting layer, wherein the buffer semiconductor layer comprises the grooves, the buffer semiconductor layer has a first region and a second region surrounding the first region, and a size of each of the sub-grooves located in the first region is different from a size of each of the sub-grooves located in the second region, wherein a roughness of the bottom surface is less than a roughness of the first region, and the roughness of the first region is less than a roughness of the second region.

2. The micro light-emitting device of claim 1, wherein in a direction away from the bottom surface toward an adjacent light-emitting layer, a roughness of the inner wall defined by the sub-grooves is greater.

3. The micro light-emitting device of claim 1, wherein a ratio of a depth to a width of each of the sub-grooves is between 0.1 and 50.

4. The micro light-emitting device of claim 1, wherein a ratio of an emission wavelength of the micro light-emitting device to a depth or a width of each of the sub-grooves is between 1 and 2000.

5. The micro light-emitting device of claim 1, wherein the inner wall of each of the grooves is divided into at least one first region and at least one second region, and a roughness of the at least one first region is different from a roughness of the at least one second region.

6. The micro light-emitting device of claim 5, wherein an area range of the at least one first region and the at least one second region of one of the grooves is different from an area range of the at least one first region and the at least one second region of another of the grooves.

7. A micro light-emitting device display apparatus, comprising:
a display substrate; and
at least one micro light-emitting device disposed on the display substrate and electrically connected to the display substrate, wherein the at least one micro light-emitting device comprises:
an epitaxial structure having a bottom surface and comprising a plurality of grooves, wherein the grooves are located on the bottom surface, each of the grooves comprises a plurality of sub-grooves, and the sub-grooves define an inner wall of each of the grooves, wherein a ratio of a size of each of the grooves to a size of each of the sub-grooves is greater than 1 and less than or equal to 4000;
a first-type electrode disposed on the epitaxial structure; and
a second-type electrode disposed on the epitaxial structure and separated from the first-type electrode and having different electrical properties from the first-type electrode;
wherein the epitaxial structure further comprises:
a first-type semiconductor layer electrically connected to the first-type electrode;
a second-type semiconductor layer electrically connected to the second-type electrode;
a light-emitting layer disposed between the first-type semiconductor layer and the second-type semiconductor layer; and
a buffer semiconductor layer having the bottom surface and disposed on a surface of the second-type semiconductor layer relatively far away from the light-emitting layer, wherein the buffer semiconductor layer comprises the grooves, the buffer semiconductor layer has a first region and a second region surrounding the first region, and a size of each of the sub-grooves located in the first region is different from a size of each of the sub-grooves located in the second region, wherein a roughness of the bottom surface is less than a roughness of the first region, and the roughness of the first region is less than a roughness of the second region.

8. An epitaxial structure, comprising:
a first-type semiconductor layer;
a second-type semiconductor layer disposed on the first-type semiconductor layer;
a light-emitting layer disposed between the first-type semiconductor layer and the second-type semiconductor layer; and
a buffer semiconductor layer disposed on a surface of the second-type semiconductor layer relatively far away from the light-emitting layer, wherein the buffer semiconductor layer has a bottom surface and comprises a plurality of grooves, the grooves are located on the bottom surface, each of the grooves comprises a plurality of sub-grooves, the sub-grooves define an inner wall of each of the grooves, and a ratio of a size of each of the grooves to a size of each of the sub-grooves is greater than 1 and less than or equal to 4000, wherein the buffer semiconductor layer has a first region and a second region surrounding the first region, and a size of each of the sub-grooves located in the first region is different from a size of each of the sub-grooves located in the second region, wherein a roughness of the bottom surface is less than a roughness of the first region, and the roughness of the first region is less than a roughness of the second region.

* * * * *